(12) United States Patent
Shin

(10) Patent No.: US 7,952,386 B2
(45) Date of Patent: May 31, 2011

(54) DATA INPUT/OUTPUT MULTIPLEXER OF SEMICONDUCTOR DEVICE

(75) Inventor: Beom-Ju Shin, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/499,561

(22) Filed: Jul. 8, 2009

(65) Prior Publication Data

US 2009/0273365 A1    Nov. 5, 2009

Related U.S. Application Data

(63) Continuation of application No. 11/529,286, filed on Sep. 29, 2006, now Pat. No. 7,577,038.

(30) Foreign Application Priority Data

Sep. 29, 2005   (KR) ............................. 2005-0091548
May 31, 2006   (KR) ............................. 2006-0049113

(51) Int. Cl.
   *H03K 19/173*   (2006.01)
   *H03K 17/00*    (2006.01)
   *G06F 7/38*     (2006.01)

(52) U.S. Cl. ............................. 326/37; 326/38; 327/407
(58) Field of Classification Search .................... 326/37, 326/38, 41; 365/189.02, 191; 327/407
See application file for complete search history.

(56) References Cited

U.S. PATENT DOCUMENTS

| | | | | |
|---|---|---|---|---|
| 5,530,378 A | * | 6/1996 | Kucharewski et al. | ......... 326/41 |
| 6,097,640 A | * | 8/2000 | Fei et al. | .................. 365/189.02 |
| 7,085,171 B2 | * | 8/2006 | Song | ......................... 365/189.02 |
| 7,577,038 B2 | * | 8/2009 | Shin | ......................... 365/189.02 |
| 2007/0070712 A1 | * | 3/2007 | Shin | ......................... 365/189.02 |

* cited by examiner

Primary Examiner — Daniel D Chang
(74) Attorney, Agent, or Firm — JP & T Group LLP

(57) ABSTRACT

There is provided an input/output multiplexer capable of reducing a layout area in designing a device by disposing first and second multiplexers at either side of a specific data input/output (I/O) pad. An apparatus for multiplexing data inputted or outputted to a global input/output (I/O) line includes a first multiplexer for multiplexing the data and supplying a first multiplexed data to the global I/O line and a second multiplexer for multiplexing the first multiplexed data supplied to the global I/O line, wherein the first and second multiplexers are formed at either side of the global I/O line.

17 Claims, 12 Drawing Sheets

DATA INPUT/OUTPUT MULTIPLEXER OF SEMICONDUCTOR DEVICE

This application is a continuation of U.S. patent application Ser. No. 11/529,286 filed on Sep. 29, 2006 now U.S. Pat. No. 7,577,038, which claims priority of Korean patent application number 10-2005-0091548 filed on Sep. 29, 2005 and Korean patent application number 10-2006-0049113 filed on May 31, 2006.

FIELD OF THE INVENTION

The present invention relates to a semiconductor design technology; and, more particularly, to a multiplexer for multiplexing input/output data.

DESCRIPTION OF RELATED ART

Recently, a semiconductor device is designed such that it has an input/output path of multi-bit structure according to a data option mode for increasing data transmission rate. Herein, the data option mode, e.g., x4, x8, x16, etc, represents the number of data bits which are simultaneously read from or written onto a memory at one-time addressing. Thus, semiconductor devices may be differently configured even though they have the same capacity. That is, 'x4', 'x8', and 'x16' operation modes mean that the semiconductor devices have 4-bit, 8-bit and 16-bit architecture, respectively. Therefore, after the semiconductor device is fabricated such that it satisfies all of the 'x4', 'x8', and 'x16' operation modes, the semiconductor device is constructed such that it operates in the 'x4', 'x8', or 'x16' operation mode according to a selected option.

FIGS. 1A to 1C are block diagrams showing a conventional flow of data multiplexed according to 'x4', 'x8', and 'x16'operation modes.

For the sake of illustrative convenience, global input/output (I/O) lines GIO_L<0:7> and GIO_U<0:7> are divided into bottom global I/O lines GIO_L<0:7>, and upper global I/O lines GIO_U<0:7>. Likewise, data input/output (I/O) pads LDQ<0:7> and UDQ<0:7> are divided into bottom data I/O pads LDQ<0:7> and upper data I/O pads UDQ<0:7>. Also, local input/output (I/O) lines LIO_L<0:7> and LIO_U<0:7> are divided into bottom local I/O lines LIO_L<0:7>, and upper local I/O lines LIO_U<0:7>.

Referring to FIGS. 1A to 1C, input/output data of the semiconductor device are transferred via each different data path according to the 'x4', 'x8', and 'x16' operation modes. Referring to FIG. 1A, in case of inputting the data in the 'x16' operation mode, the data are transferred to respective local I/O lines LIO_L<0:7> and LIO_U<0:7> through respective global I/O lines GIO_L<0:7> and GIO_U<0:7> corresponding to respective data I/O pads LDQ<0:7> and UDQ<0:7>. Conversely, in case of outputting the data in the 'x16' operation mode, the data of the respective local I/O lines LIO_L<0:7> and LIO_U<0:7> are outputted to the respective data I/O pads LDQ<0:7> and UDQ<0:7> through the respective corresponding global I/O lines GIO_L<0:7> and GIO_U<0:7>.

Referring to FIG. 1B, in case of inputting the data in the 'x8' operation mode, 8-bit data inputted through the bottom data I/O pads LDQ<0:7> are applied to the bottom global I/O lines GIO_L<0:7> or the upper global I/O lines GIO_U<0:7> in response to a row address signal RA<13>. Thereafter, the data supplied to the bottom global I/O lines GIO_L<0:7> or the upper global I/O lines GIO_U<0:7> are transferred to the corresponding bottom local I/O lines LIO_L<0:7> or upper local I/O lines LIO_U<0:7>. Contrariwise, in case of outputting the data in the 'x8' operation mode, the 8-bit data supplied to the bottom or upper local input output lines LIO_L<0:7> or LIO_U<0:7> are applied to the corresponding bottom or upper global I/O lines GIO_L<0:7> or GIO_U<0:7> and thereafter, they are outputted to the bottom data I/O pads LDQ<0:7>.

Referring to FIG. 1C, in case of inputting the data in the 'x4' operation mode, 4-bit data may be applied to the respective global I/O lines GIO_L<0:3>, GIO_L<4:7>, GIO_U<0:3>, or GIO_U<4:7> in response to a row address signal RA<13> and a column address signal CA<11>. Thereafter, the applied 4-bit data are transferred to the corresponding local I/O lines LIO_L<0:3>, LIO_L<4:7>, LIO_U<0:3> or LIO_U<4:7> through the respective global I/O lines GIO_L<0:3>, GIO_L<4:7>, GIO_U<0:3>, or GIO_U<4:7>. Conversely, in case of outputting the data in the 'x4' operation mode, the 4-bit data supplied to the respective local I/O lines LIO_L<0:3>, LIO_L<4:7>, LIO_U<0:3> or LIO_U<4:7> are applied to the corresponding global I/O lines GIO_L<0:3>, GIO_L<4:7>, GIO_U<0:3>, or GIO_U<4:7>, and the data are then outputted to the bottom data I/O pads LDQ<0:3>.

FIG. 2A is a block diagram illustrating a conventional input multiplexer 10.

Referring to FIG. 2A, 4-bit, 8-bit or 16-bit data inputted according to the data option mode, i.e., the 'x4', 'x8', or 'x16' operation mode, are inputted into the conventional input multiplexer 10 through the data I/O pads LDQ<0:7> and UDQ<0:7>. The conventional input multiplexer 10 applies the data to predetermined global I/O lines GIO_L<0:7> and GIO_U<0:7>, and transfers the data to corresponding local I/O lines LIO_L<0:7> and LIO_U<0:7> through the global I/O lines GIO_L<0:7> and GIO_U<0:7>.

FIG. 2B is a block diagram illustrating a conventional output multiplexer 20.

Referring to FIG. 2B, the 4-bit, 8-bit or 16-bit data to be outputted from the local I/O lines LIO_L<0:7> and LIO_U<0:7> are applied to the global I/O lines GIO_L<0:7> and GIO_U<0:7> which are correspondingly connected to the local I/O lines LIO_L<0:7> and LIO_U<0:7>. The conventional output multiplexer 20 selects the global I/O lines GIO_L<0:7> and GIO_U<0:7> to which the data have been applied, and outputs the data through the corresponding data I/O pads LDQ<0:7> and UDQ<0:7>.

FIG. 3 is a block diagram illustrating the conventional input multiplexer 10 shown in FIG. 2A. In FIG. 3, there is illustrated only a representative portion of the conventional input multiplexer 10. That is, in the conventional input multiplexer 10, there are employed an input multiplexer 11 corresponding to a zeroth bottom data I/O pad LDQ<0> of the bottom data I/O pads LDQ<0:7>, an input multiplexer 12 corresponding to a fourth bottom data I/O pad LDQ<4>, and drivers DRV7 and DRV8 corresponding to zeroth and fourth upper data I/O pads UDQ<C> and UDQ<4> of the upper data I/O pads UDQ<0:7>. Herein, although the input multiplexer 11 corresponding to the zeroth data I/O pad LDQ<0> has the same configuration as other input multiplexers (not shown) which are correspondent to first to third bottom data I/O pads LDQ<1:3>, they are connected to respective different global I/O lines. In detail, the outputs of the multiplexer 11 corresponding to the zeroth data I/O pad LDQ<0> are connected to the global I/O lines GIO_L<0>, GIO_L<4>, GIO_U<0> and GIO_U<4>, respectively. The outputs of the multiplexer (not shown) corresponding to the first bottom data I/O pad LDQ<1> are connected to the global I/O lines GIO_L<1>, GIO_L<5>, GIO_U<1> and GIO_U<5>, respectively. Likewise, the outputs of the multiplexer (not shown) corresponding to the second bottom data I/O pad LDQ<2> are connected to the global I/O lines GIO_L<2>, GIO_L<6>, GIO_U<2> and GIO_U<6>, respectively. The outputs of the multiplexer (not shown) corresponding to the third bottom data I/O pad LDQ<3> are connected to the global I/O lines GIO_L<3>, GIO_L<7>, GIO_U<3> and GIO_U<7>, respectively.

In addition, although the input multiplexer 12 corresponding to the fourth data I/O pad LDQ<4> has the same configuration as other input multiplexers (not shown) which are correspondent to fifth to seventh bottom data I/O pads LDQ<5:7>, they are connected to respective different global I/O lines. That is, the outputs of the multiplexer 12 corresponding to the LDQ<4> are connected to the global I/O lines GIO_L<4> and GIO_U<4>, respectively. The outputs of the multiplexer (not shown) corresponding to the fifth bottom data I/O pad LDQ<5> are connected to the global I/O lines GIO_L<5> and GIO_U<5>, respectively. The outputs of the multiplexer (not shown) corresponding to the sixth bottom data I/O pad LDQ<6> are connected to the global I/O lines GIO_L<6> and GIO_U<6>, respectively. Likewise, the outputs of the multiplexer (not shown) corresponding to the seventh bottom data I/O pad LDQ<7> are connected to the global I/O lines GIO_L<7> and GIO_U<7>, respectively. Similarly, the outputs of the drivers corresponding to the upper data I/O pads UDQ<0:7> are connected to the corresponding upper global I/O lines GIO_U<0:7>, respectively.

The input multiplexer 11, which is configured with four drivers DRV1, DRV2, DRV3 and DRV4 for receiving respective control signals A, B, C and D therethrough, applies the data to one of the global I/O lines GIO_L<0>, GIO_L<4>, GIO_U<0> and GIO_U<4> in response to the control signal A, B, C or D. That is, the input data applied through the zeroth bottom data I/O pad LDQ<0> are applied to the zeroth and fourth bottom global I/O lines GIO_L<0> and GIO_L<4> in response to the control signals A and B, respectively. Similarly, the input data applied through the zeroth bottom data I/O pad LDQ<0> are applied to the first and fourth upper global I/O lines GIO_U<0> and GIO_U<4> in response to the control signals C and D, respectively.

The input multiplexer 12 corresponding to the fourth bottom data I/O pad LDQ<4>, which is configured with two drivers DRV5 and DRV6 for receiving control signals E and F, respectively, applies the data to one of the global I/O lines GIO_L<4> and GIO_U<4> in response to the control signals E and F, respectively. That is, the data inputted into the fourth bottom data I/O pad LDQ<4> are applied to the fourth bottom global I/O line GIO_L<4> and the fourth upper global I/O line GIO_U<4> in response to the control signals E and F, respectively.

In addition, other drivers (not shown) corresponding to the upper data I/O pads UDQ<0:7> receive a data option signal 'x16' according to a data option mode, so as apply the data to the corresponding upper global I/O lines GIO_U<0:7>, respectively.

Following tables 1 and 2 illustrate the state of logic level of the control signal A, B, C, D, E and F generated in response to the data option signal x4, x8 and x16, the row address signal RA<13> and the column address signal CA<11>.

TABLE 1

|  | RA<13> | CA<11> | A | B | C | D |
|---|---|---|---|---|---|---|
| x4 | 0 | 0 | 0 | 0 | 1 | 0 |
|  | 0 | 1 | 0 | 0 | 0 | 1 |
|  | 1 | 0 | 1 | 0 | 0 | 0 |
|  | 1 | 1 | 0 | 1 | 0 | 0 |

TABLE 1-continued

|  | RA<13> | CA<11> | A | B | C | D |
|---|---|---|---|---|---|---|
| x8 | 0 | x | 0 | 0 | 1 | 0 |
|  | 1 | x | 1 | 0 | 0 | 0 |
| x16 | x | x | 1 | 0 | 0 | 0 |

TABLE 2

|  | RA<13> | CA<11> | E | F |
|---|---|---|---|---|
| x4 | x | x | 0 | 0 |
| x8 | 0 | x | 0 | 1 |
|  | 1 | x | 1 | 0 |
| x16 | x | x | 1 | 0 |

Considering the data input operation with reference to the tables 1 and 2, the 8-bit data is inputted to a corresponding data input sense amplifier 30 through the bottom data I/O pads LDQ<0:7> in the 'x8' operation mode. Thereafter, the amplified data is inputted to the corresponding input multiplexers 11 and 12, respectively. Afterwards, the data inputted to the input multiplexers 11 and 12 is applied to the bottom global I/O lines GIO_L<0:7> in response to the control signals A and E, or applied to the upper global I/O lines GIO_U<0:7> in response to the control signals C and F. Then, the applied 8-bit data are transferred to the bottom or upper local I/O lines LIO_L<0:7> or LIO_U<0:7> through a write driver 40 corresponding to the bottom or upper global I/O lines GIO_L<0:7> or GIO_U<0:7>.

Meanwhile, since the input operations of the 'x16' and 'x4' operation modes are similar to those of the 'x8' operation mode, detailed descriptions about the input operations will be omitted herein.

FIG. 4 is a block diagram illustrating the conventional output multiplexer 20 shown in FIG. 2B. In FIG. 4, there is illustrated only a representative portion of the conventional output multiplexer 20. In the output multiplexing unit 20, there are employed an output multiplexer 21 corresponding to the zeroth bottom data I/O pad LDQ<0>, and an output multiplexer 22 corresponding to the fourth bottom data I/O pad LDQ<4>. Herein, although the output multiplexer 21 corresponding to the zeroth bottom data I/O pad LDQ<0> has the same configuration as other output multiplexers (not shown) which are correspondent to the first to third bottom data I/O pads LDQ<1:3>, they are connected to respective different global I/O lines. In detail, the output multiplexer 21 corresponding to the zeroth bottom data I/O pad LDQ<0> receives the data supplied to the global I/O lines GIO_L<0>, GIO_L<4>, GIO_U<0> and GIO_U<4>, and an output multiplexer (not shown) corresponding to the first bottom data I/O pad LDQ<1> receives the data supplied to the global I/O lines GIO_L<1>, GIO_L<5>, GIO_U<1> and GIO_U<5>. Likewise, an output multiplexer (not shown) corresponding to the second bottom data I/O pad LDQ<2> receives the data supplied to the global I/O lines GIO_L<2>, GIO_L<6>, GIO_U<2> and GIO_U<6>, and an output multiplexer (not shown) corresponding to the third bottom data I/O pad LDQ<3> receives the data supplied to the global I/O lines GIO_L<3>, GIO_L<7>, GIO_U<3> and GIO_U<7>.

Furthermore, although the output multiplexer 22 corresponding to the fourth data I/O pad LDQ<4> has the same configuration as other output multiplexers (not shown) which are correspondent to the fourth to seventh bottom data I/O pads LDQ<4:7>, they are connected to different global I/O lines, respectively. In detail, the output multiplexer 22 corresponding to the fourth bottom data I/O pad LDQ<4> receives the data supplied to the global I/O lines GIO_L<4> and GIO_U<4>, and an output multiplexer (not shown) corresponding to the fifth bottom data I/O pad LDQ<5> receives the data supplied to the global I/O lines GIO_L<5> and GIO_U<5>. Likewise, an output multiplexer (not shown) corresponding to the sixth bottom data I/O pad LDQ<6> receives the data supplied to the global I/O lines GIO_L<6> and GIO_U<6>, and an output multiplexer (not shown) corresponding to the seventh bottom data I/O pad LDQ<7> receives the data supplied to the global I/O lines GIO_L<7> and GIO_U<7>.

The output multiplexer 21 corresponding to the zeroth bottom data I/O pad LDQ<0> has a 4-input multiplexer MUX1 receiving the data option signal x4, x8 and x16, the row address signal RA<13> and the column address signal CA<11>. Herein, the output multiplexer 21 outputs one of the data supplied to the global I/O lines GIO_L<0>, GIO_L<4>, GIO_U_<0> and GIO_U<4> in response to a predetermined control signal.

In addition, the output multiplexer 22 corresponding to the fourth bottom data I/O pad LDQ<4> has a 2-input multiplexer MUX2 receiving the data option signal x4, x8 and x16, the row address signal RA<13> and the column address signal CA<11>. The output multiplexer 21 outputs one of the data supplied to the global I/O lines GIO_L<0>, GIO_L<4>, GIO_U<0> and GIO_U<4> in response to a predetermined control signal.

Table 3 illustrates the global I/O line GIO_L<0>, GIO_L<4>, GIO_<0> and GIO_<4> selected according to the data option signal x4, x8 and x16, the row address signal RA<13> and the column address signal CA<11>, wherein the data option signal x4, x8 and x16, the row address signal RA<13> and the column address signal CA<11> control the output multiplexer 21.

TABLE 3

|     | RA<13> | CA<11> | OUT1 |
| --- | --- | --- | --- |
| x4  | 0 | 0 | GIO_U<0> |
|     | 0 | 1 | GIO_U<4> |
|     | 1 | 0 | GIO_L<0> |
|     | 1 | 1 | GIO_L<4> |
| x8  | 0 | x | GIO_U<0> |
|     | 1 | x | GIO_L<0> |
| x16 | x | x | GIO_L<0> |

Table 4 illustrates the global I/O line GIO_L<4> and GIO_U<4> selected according to the data option signal x4, x8 and x16, the row address signal RA<13> and the column address signal CA<11>, wherein the data option signal x4, x8 and x16, the row address signal RA<13> and the column address signal CA<11> control the output multiplexer 22.

TABLE 4

|     | RA<13> | CA<11> | OUT2 |
| --- | --- | --- | --- |
| x4  | 0 | 0 | GIO_U<4> |
|     | 0 | 1 | GIO_U<4> |
|     | 1 | 0 | GIO_L<4> |
|     | 1 | 1 | GIO_L<4> |
| x8  | 0 | x | GIO_U<4> |
|     | 1 | x | GIO_L<4> |
| x16 | x | x | GIO_L<4> |

Considering the data output operation with reference to the tables 3 and 4, the data to be outputted from the local I/O lines LIO_L<0:7> and LIO_U<0:7> are amplified at a sense amplifier 50 and then inputted to a driver 60. At this time, each driver 60 receives one of the data option signals x4, x8 and x16, the row address signal RA<13> and the column address signal CA<11>, and applies the output data to the corresponding global I/O lines GIO_L<0:7> and GIO_U<0:7>. The conventional output multiplexer 20 selects the data supplied to the predetermined global I/O lines GIO_L<0:7> and GIO_U<0:7> in response to the data option signal x4, x8 and x16, the row address signal RA<13> and the column address signal CA<11>. Thereafter, the output data is latched at a corresponding pipe latch 70, and then outputted to the corresponding data I/O pad LDQ<0:7> and UDQ<0:7>.

For instance, the 8-bit data, which is outputted through the bottom or upper local I/O lines LIO_L<0:7> or LIO_U<0:7>, is applied to the upper or bottom global I/O lines GIO_L<0:7> or GIO_U<0:7> in response to the data option signal x4, x8 and x16, the row address signal RA<13> and the column address signal CA<11>, in the 'x8' operation mode. The conventional output multiplexer 20 selects the bottom or upper global I/O lines GIO_L<0:7> or GIO_U<0:7> in response to the data option signal x4, x8 and x16, the row address signal RA<13> and the column address signal CA<11>, to output the 8-bit data to the bottom data I/O pads LDQ<0:7>.

In the meantime, the output operations of the 'x16' and 'x4' operation modes are similar to the 'x8' operation mode so that further descriptions will be omitted herein.

Referring back to FIG. 3 for explaining the problem of the prior art, each of the input multiplexers 11 corresponding to the first to third data I/O pads LDQ<0:3> is configured with four drivers DRV1, DRV2, DRV3 and DRV4. This configuration causes a layout area to be relatively increased in comparison with areas around the other data I/O pads. In particular, as the number of prefetch bits increases in a DDR2 SDRAM or a DDR3 SDRAM, it is burdensome to design a layout within a restricted area. For example, because of 8-bit prefetch architecture of the DDR3 SDRAM, the number of drivers required in the input multiplexer 11 corresponding to the data I/O pads LDQ<0:3> should be 32, which is calculated by multiplying the number of drivers per one multiplexer 11, i.e., 4, by the number of the prefetch bits, i.e., 8.

In addition, because it is necessary to employ the 4-input multiplexer MUX1 around the zeroth bottom data I/O pad LDQ<0> shown in FIG. 3, it is relatively difficult to secure appropriate layout area around the zeroth bottom data I/O pad LDQ<0>.

In other words, since the four drivers DRV1, DRV2, DRV3 and DRV4 (not considering the prefetch), and the 4-input multiplexer MUX1 should be densely concentrated around the bottom data I/O pads LDQ<0:3>, it is difficult to design the layout of the device appropriately. Further, this problem of the layout design becomes more serious in consideration of the number of prefetch bits, and resultingly, this makes the chip size increased after all.

SUMMARY OF THE INVENTION

It is, therefore, an object of the present invention to provide an input/output multiplexer capable of reducing a layout area in designing a device by disposing first and second multiplexers at either side of a specific data input/output pad.

In accordance with an aspect of the present invention, there is provided an apparatus for multiplexing data inputted or outputted to a global input/output (I/O) line, including a first multiplexer for multiplexing the data and supplying a first multiplexed data to the global I/O line and a second multiplexer for multiplexing the first multiplexed data supplied to the global I/O line, wherein the first and second multiplexers are formed at either side of the global I/O line.

In accordance with another aspect of the present invention, there is provided a semiconductor device, including a data input/output (I/O) pad for receiving data, a first input multiplexer for multiplexing the data inputted through the data I/O pad and supplying a first multiplexed data to a global I/O line, wherein the first input multiplexer is located between the data I/O pad and the global I/O line, and a second input multiplexer for multiplexing the first multiplexed data supplied to the global I/O line and supplying a second multiplexed data to a local input/output (I/O) line, wherein the second input multiplexer is disposed between the global I/O line and the local I/O line.

In accordance with still another aspect of the present invention, there is provided a semiconductor device, including a local I/O line, a first output multiplexer for multiplexing data inputted to the local I/O line and supplying a first multiplexed data to the global I/O line, wherein the first output multiplexer is formed between the local I/O line and the global I/O line, and a second output multiplexer for multiplexing the first multiplexed data supplied to the global I/O line and providing a second multiplexed data to the data I/O pad, wherein the second output multiplexer is located between the global I/O line and the data I/O pad.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A data input/output multiplexer of a semiconductor device in accordance with exemplary embodiments of the present invention will be described in detail with reference to the accompanying drawings.

Figure 1A:
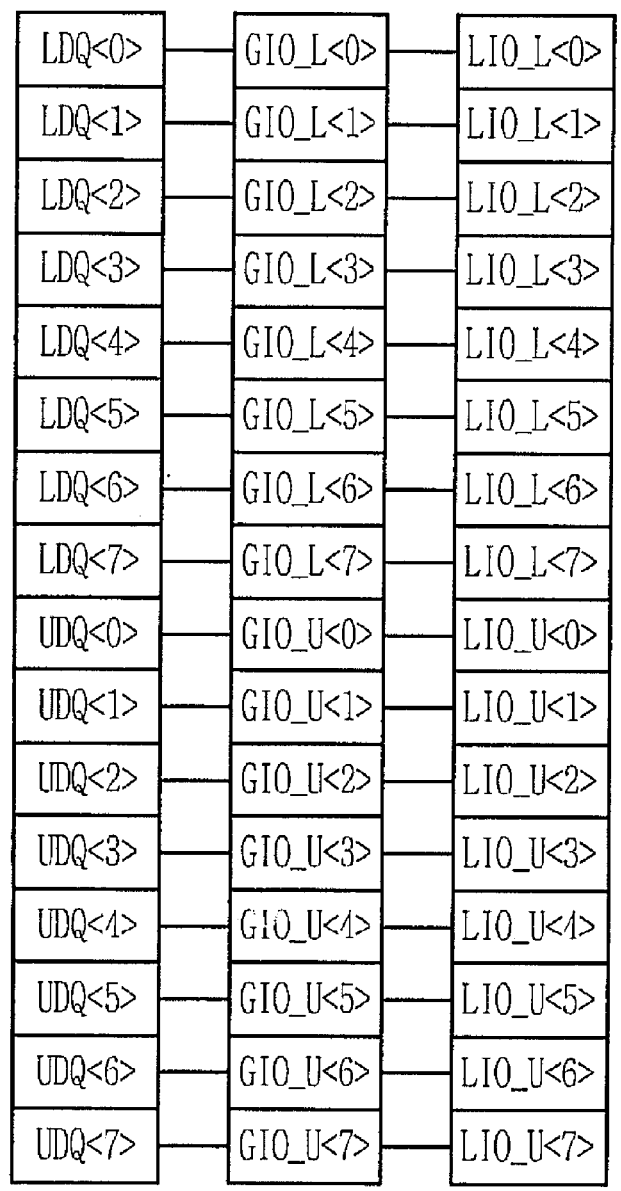
FIGS. 1A to 1C are block diagrams showing a conventional flow of data multiplexed according to 'x4', 'x8', and 'x16' operation modes.
Figure 1B:
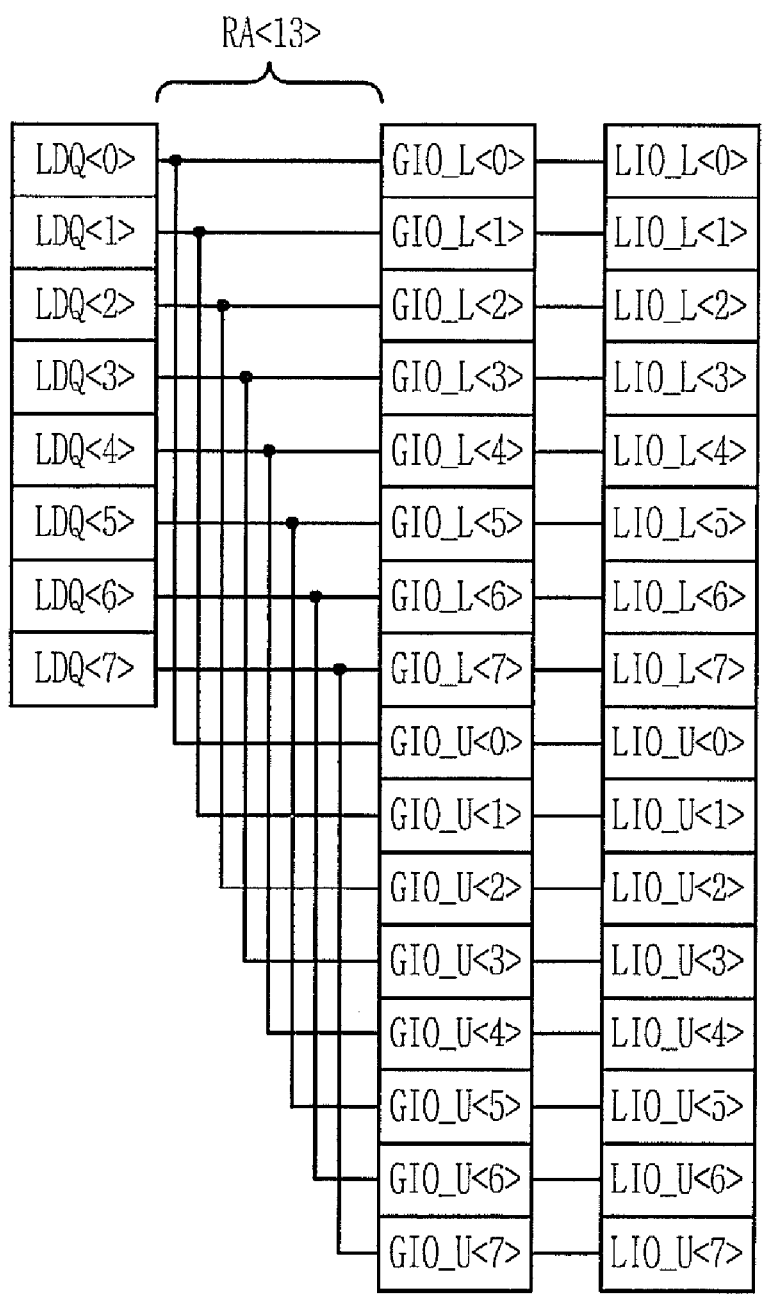
Figure 1C:
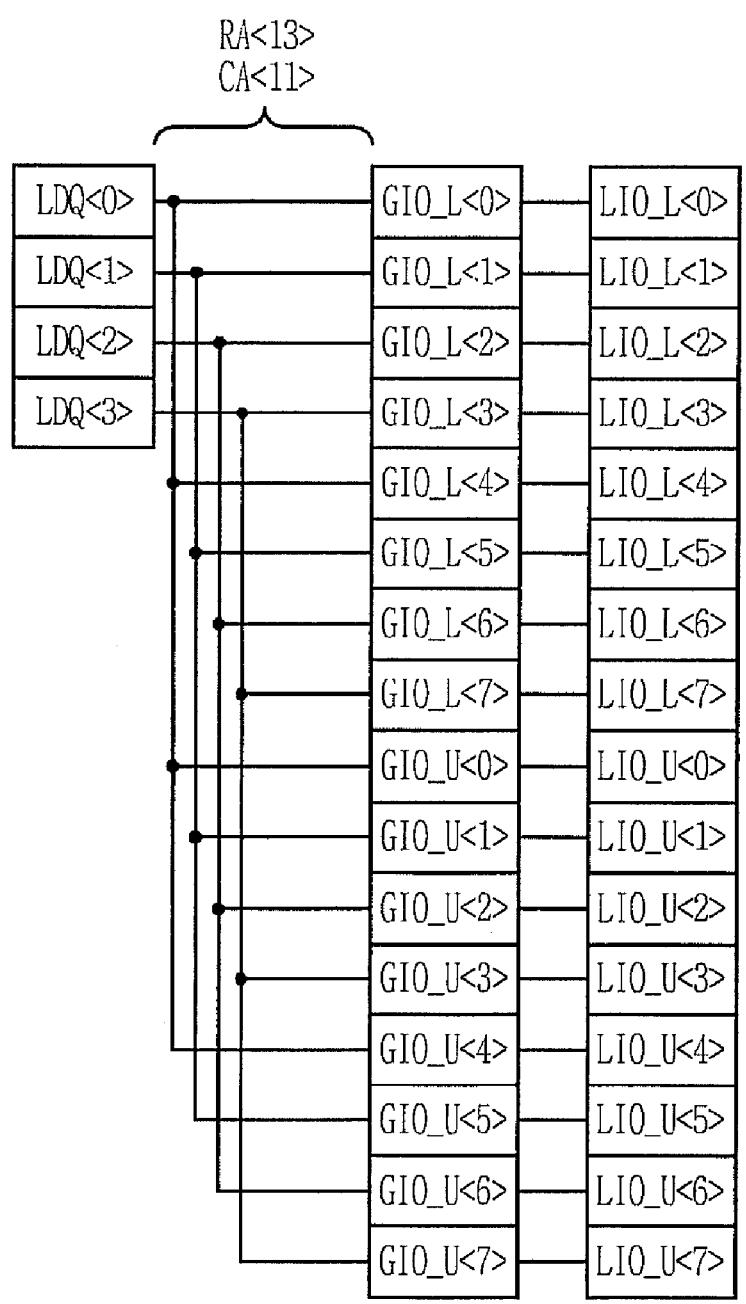
Figure 2A:
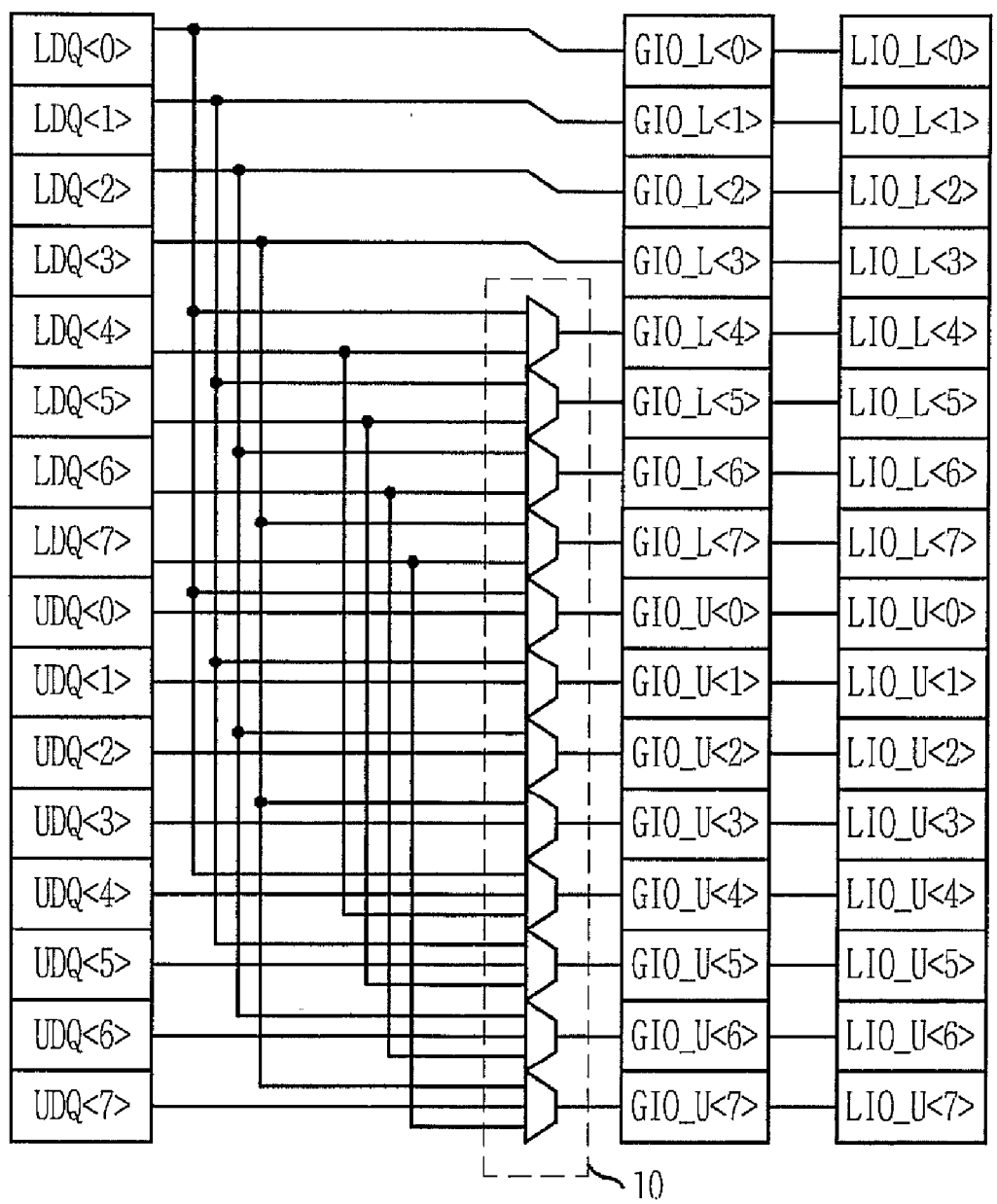
FIGS. 2A and 2B are block diagrams describing a conventional input/output multiplexer.
Figure 2B:
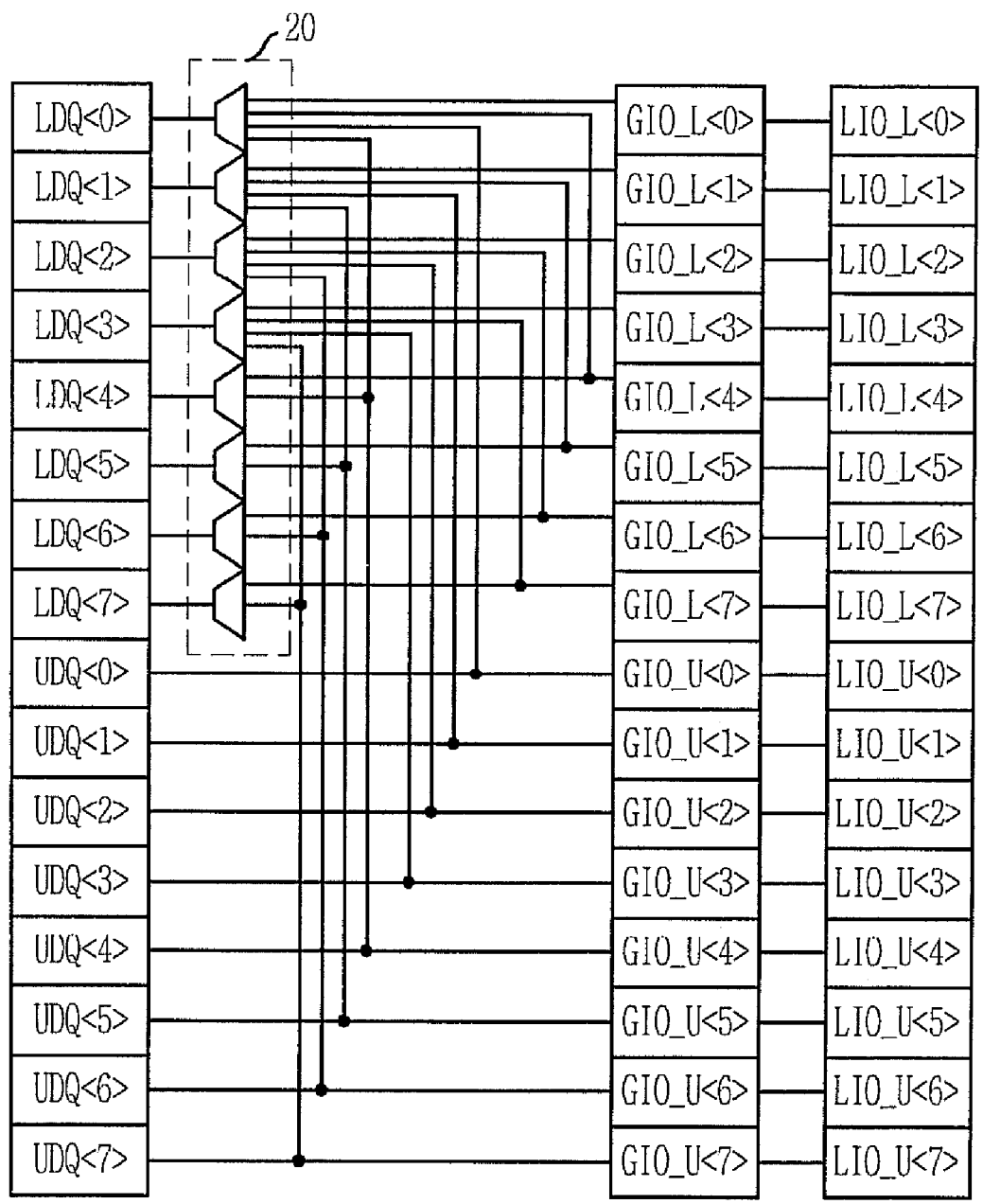
Figure 3:
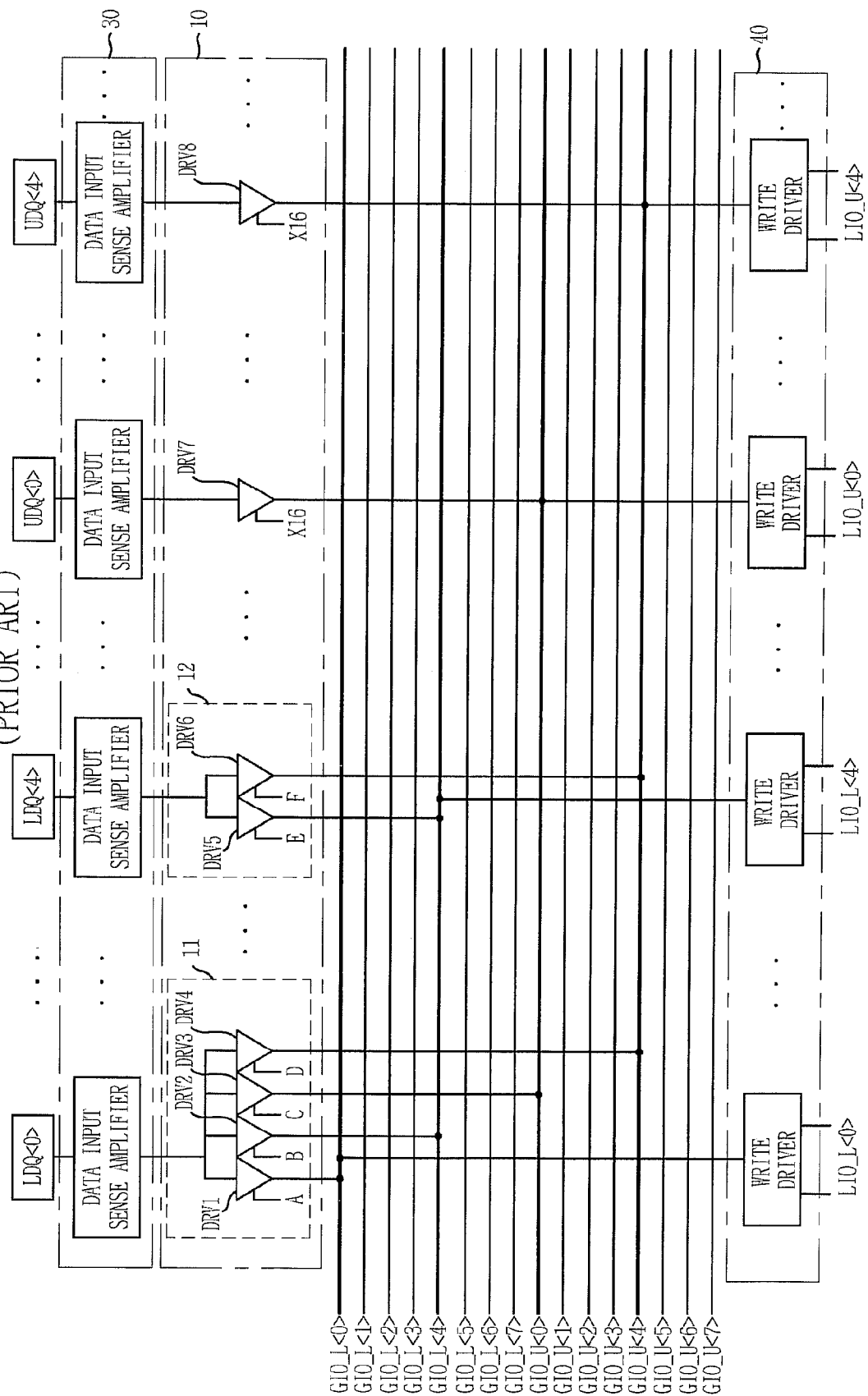
FIG. 3 is a block diagram illustrating a conventional input multiplexer shown in FIG. 2A.
Figure 4:
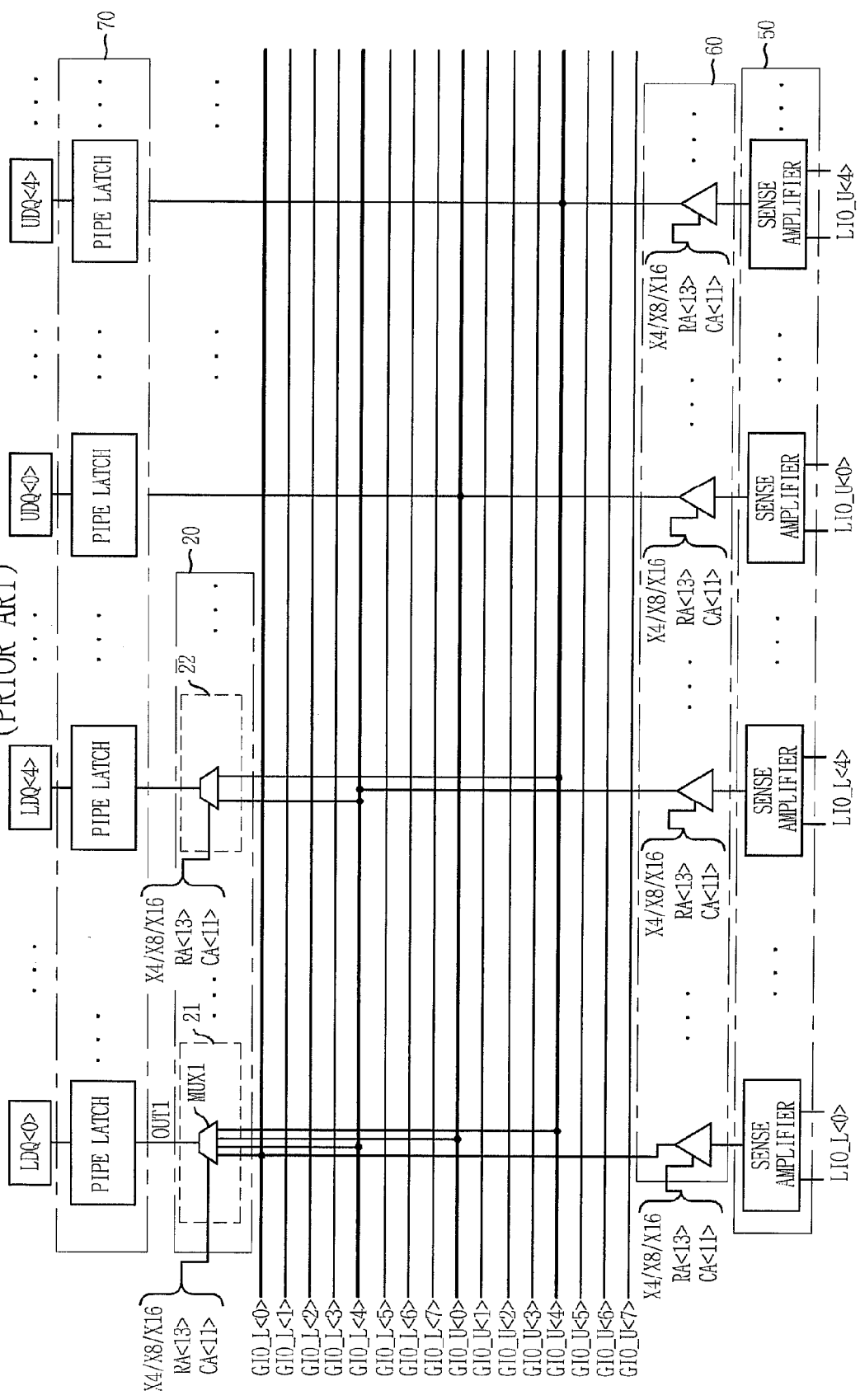
FIG. 4 is a block diagram illustrating a conventional output multiplexer shown in FIG. 2B.
Figure 5:
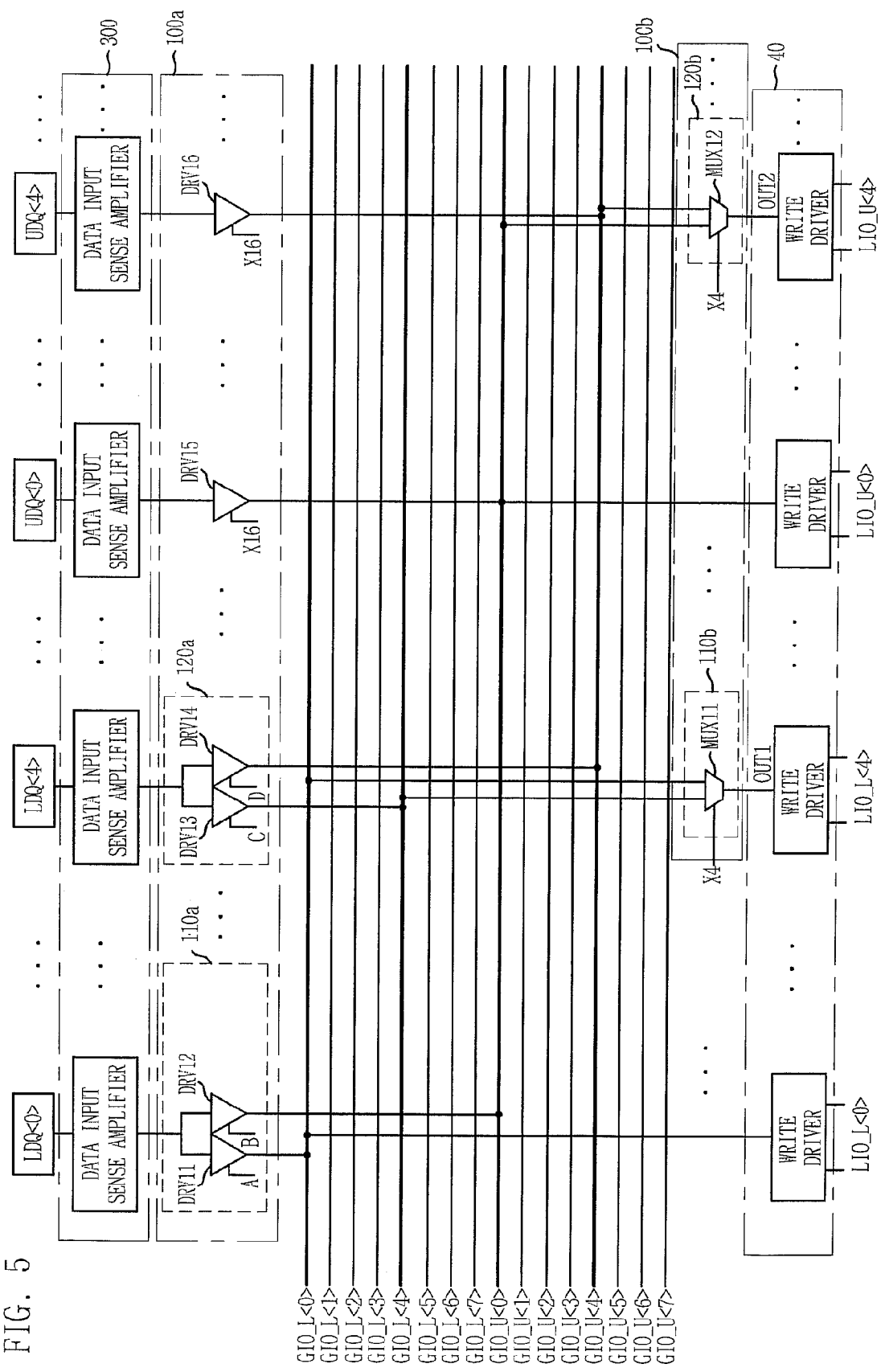
FIG. 5 is a block diagram depicting first and second input multiplexers in accordance with an embodiment of the present invention.

FIG. 5 is a block diagram depicting first and second input multiplexers 100a and 100b in accordance with the present invention.

Referring to FIG. 5, there are shown only representative portions of the first and second input multiplexers 100a and 100b. In the first input multiplexer 100a, there are employed a first input multiplexer 110a corresponding to a zeroth bottom data input/output (I/O) pad LDQ<0>, a first input multiplexer 120a corresponding to a fourth bottom data I/O pad LDQ<4> among bottom data I/O pads LDQ<0:7>, and drivers DRV15 and DRV16 corresponding to zeroth and fourth upper data I/O pads UDQ<0> and UDQ<4>.

Herein, the first input multiplexer 110a corresponding to the zeroth bottom data I/O pad LDQ<0> is configured with a driver DRV11 receiving a control signal A, and a driver DRV12 receiving a control signal B. Although the first input multiplexers (not shown) corresponding to first to third bottom data I/O pads LDQ<1:3> are configured like the first input multiplexer 110a, they are connected to different global I/O lines, respectively. That is, the first input multiplexer 110a corresponding to the zeroth bottom data I/O pad LDQ<0> is connected to the global I/O lines GIO_L<0> and GIO_U<0>, and the first input multiplexer (not shown) corresponding to a first bottom data I/O pad LDQ<1> is connected to the global I/O lines GIO_L<1> and GIO_U<1>. Likewise, the first input multiplexer (not shown) corresponding to a second bottom data I/O pad LDQ<2> is connected to the global I/O lines GIO_L<2> and GIO_U<2>, and the first input multiplexer (not shown) corresponding to a third bottom data I/O pad LDQ<3> is connected to the global I/O lines GIO_L<3> and GIO_<3>. Meanwhile, the first input multiplexer 120a corresponding to the fourth bottom data I/O pad LDQ<4> is configured with a driver DRV13 receiving a control signal C and a driver DRV14 receiving a control signal D. Although first input multiplexers (not shown) corresponding to fifth to seventh bottom data I/O pads LDQ<5:7> also have the same configuration as the first multiplexer 120a, they are connected to different global I/O lines, respectively. In detail, the first input multiplexer 120a corresponding to the fourth bottom data I/O pad LDQ<4> is connected to the global I/O lines GIO_L<4> and GIO_U<4>, and the first input multiplexer (not shown) corresponding to a fifth bottom data I/O pad LDQ<5> is connected to the global I/O lines GIO_L<5> and GIO_U<5>. Likewise, the first input multiplexer (not shown) corresponding to a sixth bottom data I/O pad LDQ<6> is connected to the global I/O lines GIO_L<6> and GIO_U<6>, and the first input multiplexer (not shown) corresponding to a seventh bottom data I/O pad LDQ<7> is connected to the global I/O lines GIO_L<7> and GIO_U<7>. In addition, other drivers (not shown) corresponding to upper data I/O pads UDQ<0:7> are connected to corresponding upper global I/O lines GIO_U<0:7>, respectively.

In the second input multiplexer 100b, there are employed a second input multiplexer 110b corresponding to a fourth bottom local I/O line LIO_L<4>, and a second input multiplexer 120b corresponding to a fourth upper local I/O line LIO_U<4>.

Herein, the second input multiplexers 110a and 120b, of which each one has a 2-input input multiplexer MUX11 or MUX12 responsive to a 'x4' data option signal, are connected different global I/O lines, respectively. That is, the 2-input multiplexer MUX11 corresponding to the fourth bottom local I/O line LIO_L<4> is connected to the global I/O lines GIO_L<0> and GIO_L<4>, and the 2-input multiplexer (not shown) corresponding to a fifth bottom local I/O line LIO_L<5> is connected to the global I/O lines GIO_L<1> and GIO_L<5>. Likewise, the 2-input multiplexer (not shown) corresponding to a sixth bottom local I/O line LIO_L<6> is connected to the global I/O lines GIO_L<2> and GIO_L<6>, and the 2-input multiplexer (not shown)

corresponding to a seventh bottom local I/O line LIO_L<7> is connected to the global I/O lines GIO_L<3> and GIO_L<7>.

In addition, the 2-input multiplexer MUX12 corresponding to a fourth upper local I/O line LIO_U<4> is connected to the global I/O lines GIO_U<0> and GIO_U<4>, and the 2-input multiplexer MUX11 (not shown) corresponding to a fifth upper local I/O line LIO_U<5> is connected to the global I/O lines GIO_U<1> and GIO_U<5>. Likewise, the 2-input multiplexer (not shown) corresponding to a sixth upper local I/O line LIO_U<6> is connected to the global I/O lines GIO_U<2> and GIO_U<6>, and the 2-input multiplexer MUX11 (not shown) corresponding to a seventh upper local I/O line LIO_U<7> is connected to the global I/O lines GIO_U<3> and GIO__<7>.

Tables 5 illustrates the state of logic level of the control signal A, B, C and D generated in response to the data option signal x4, x8 and x16, the row address signal RA<13> and the column address signal CA<11>.

TABLE 5

|  | RA<13> | CA<11> | A | B | C | D |
|---|---|---|---|---|---|---|
| x4 | 0 | 0 | 0 | 1 | 0 | 0 |
|  | 0 | 1 | 0 | 1 | 0 | 0 |
|  | 1 | 0 | 1 | 0 | 0 | 0 |
|  | 1 | 1 | 1 | 0 | 0 | 0 |
| x8 | 0 | x | 0 | 1 | 0 | 1 |
|  | 1 | x | 1 | 0 | 1 | 0 |
| x16 | x | x | 1 | 0 | 1 | 0 |

Table 6 illustrates the global I/O lines GIO_L<0:7> and GIO_U<0:7> selected by the second input multiplexer 100b in response to the data option signal x4, x8 and x16, the row address signal RA<13> and the column address signal CA<11>.

TABLE 6

|  | RA<13> | CA<11> | OUT1 | OUT2 |
|---|---|---|---|---|
| x4 | 0 | 0 | x | x |
|  | 0 | 1 | x | GIO_U<0> |
|  | 1 | 0 | x | x |
|  | 1 | 1 | GIO_L<0> | x |
| x8 | 0 | x | x | GIO_U<4> |
|  | 1 | x | GIO_L<4> | x |
| x16 | x | x | GIO_L<4> | GIO_U<4> |

Considering the data input operation with reference to the tables 5 and 6, 8-bit data inputted through the bottom data I/O pad LDQ<0:7> is amplified at a corresponding data input amplifier 300 in the 'x8' operation mode. The amplified data is then inputted to the first input multiplexer 100a. Afterwards, the input data of the first input multiplexer 100a is applied to the bottom global I/O lines GIO_L<0:7> in response to the control signals A and C, or applied to the upper global I/O lines GIO_U<0:7> in response to the control signals B and D. The second input multiplexer 100b transfers the 8-bit data supplied to the global I/O lines GIO_L<0:7> or GIO_U<0:7>, to the bottom local I/O lines LIO_L<0:7> through the bottom global I/O lines GIO_L<0:7> in response to the data option signal 'x4'. Otherwise, the 8-bit data is transferred to the upper local I/O lines LIO_U<0:7> through the upper global input/output lines GIO_U<0:7>.

For example, in case of the 'x4' operation mode, the 4-bit data is inputted to the first input multiplexer 110a through the third bottom data I/O pad LDQ<3> among the bottom data I/O pads LDQ<0:7>, and applied to the global I/O lines GIO_L<0:3> and GIO_U<0:3> in response to the control signals A and B, respectively.

At this time, the 4-bit data, which is applied to the bottom global I/O lines GIO_L<0:3> in response to the control signal A, may be transferred to the bottom local I/O lines LIO_L<0:3> through a write driver 400 corresponding to the bottom local I/O lines LIO_L<0:3>. Alternatively, the 4-bit data may be transferred to the local I/O lines LIO_L<4:7> through the 2-input multiplexer MUX11 of the second input multiplexer 110b.

In addition, the 4-bit data, which is applied to the upper global I/O lines GIO_U<0:3> in response to the control signal B, may be transferred to the upper local I/O lines LIO_U<0:3> through a write driver 400 corresponding to the upper local I/O lines LIL_U<0:3>. Alternatively, the 4-bit data may be transferred to the upper local I/O lines LIO_U<4:7> through the 2-input multiplexer MUX12 of the second input multiplexer 120b. Further descriptions for the 'x16' operation mode will be omitted herein.

Figure 6:
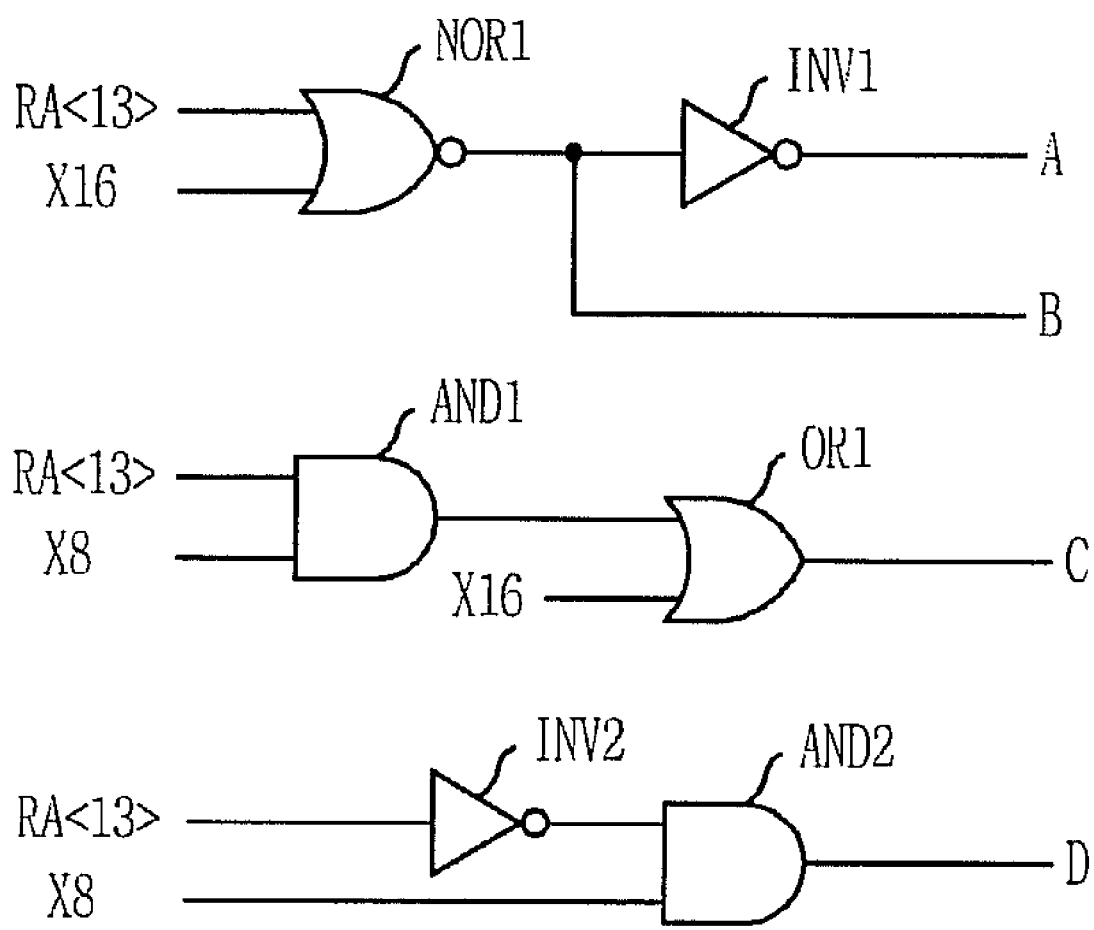
FIG. 6 is a schematic circuit diagram illustrating a control signal generator for controlling the first input multiplexer shown in FIG. 5.

FIG. 6 is a schematic circuit diagram illustrating a control signal generator for generating the control signal A, B, C and D for controlling the first input multiplexer 100a shown in FIG. 5.

Referring to FIG. 6, a control signal generator is configured with a Nlogic OR gate NOR1, an inverter INV1, a logic AND gate AND1, a logic OR gate OR1, an inverter INV2, and a logic AND gate AND2. Herein, the Nlogic OR gate NOR1 receives the data operation signal x16 and the row address signal RA<13> to output the control signal B. The inverter INV1 inverts the control signal B to output the control signal A. The logic AND gate AND1 receives the row address signal RA<13> and the data option signal x8. The logic OR gate OR1 receives the output signal of the logic AND gate AND1 and the data option signal x16 so as to output the control signal C. The inverter INV2 inverts the row address signal RA<13>. The logic AND gate AND2 receives the output signal of the inverter INV2 and the data option signal x8 to thereby output the control signal D.

Figure 7A:
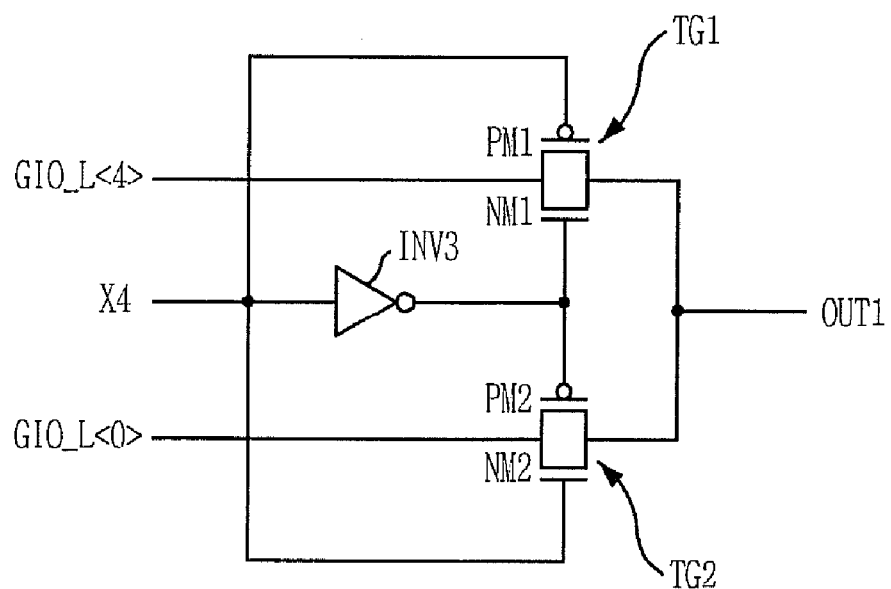
FIGS. 7A and 7B are schematic circuit diagrams showing the second input multiplexer shown in FIG. 5.
Figure 7B:
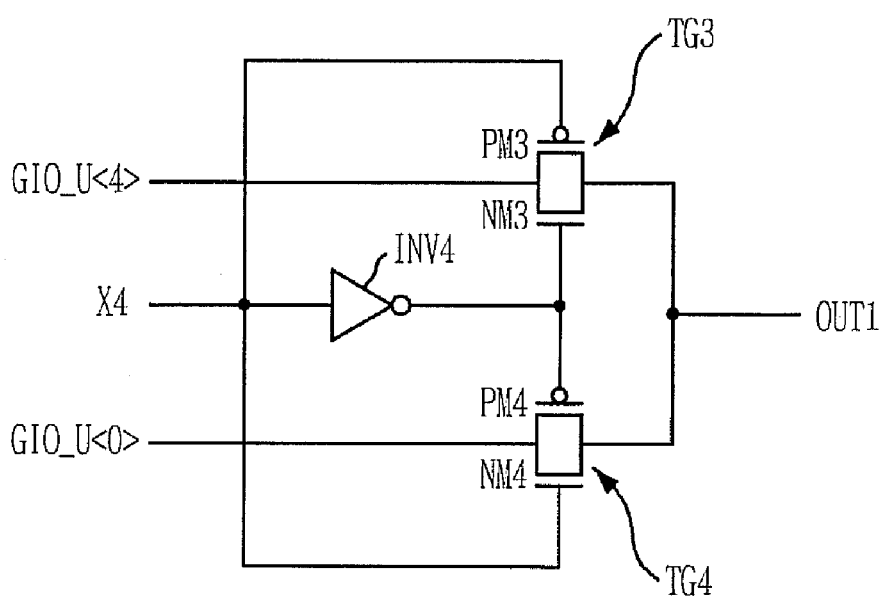

FIGS. 7A and 7B are schematic circuit diagrams showing the second input multiplexer 100b shown in FIG. 5.

Referring to FIG. 7A, the second input multiplexer 110b is configured with an inverter INV3 for inverting the data option signal x4, a transfer gate TG1 for receiving the data of the fourth bottom global I/O line GIO_L<4>, and a transfer gate TG2 for receiving the data of the zeroth bottom global I/O line GIO_L<0>. Herein, the transfer gates TG1 and TG2 are controlled by the data option signal x4.

Referring to FIG. 7B, the second input multiplexer 120b is configured with an inverter INV4 for inverting the data option signal x4, a transfer gate TG3 for receiving the data of the fourth upper global I/O line GIO_U<4>, and a transfer gate TG4 for receiving the data of the zeroth upper global I/O line GIO_U<0>. Herein, the transfer gates TG3 and TG4 are controlled by the data option signal x4.

Figure 8:
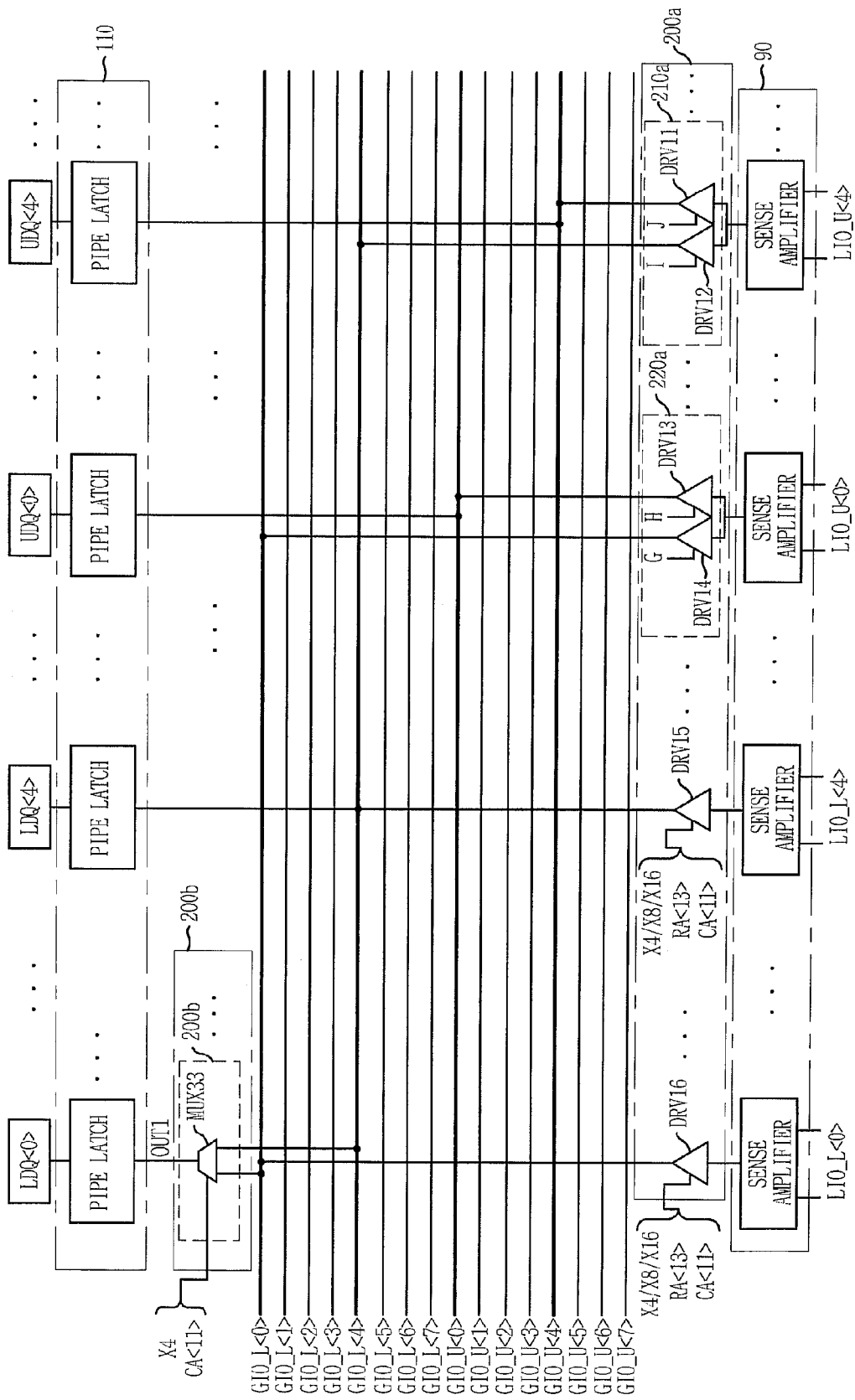
FIG. 8 is a block diagram illustrating first and second output multiplexers in accordance with an embodiment of the present invention.

FIG. 8 is a block diagram illustrating first and second output multiplexers 200a and 200b in accordance with the present invention.

Referring to FIG. 8, there are shown only representative portions of the first and second output multiplexers 200a and 200b. In the first input multiplexer 200a, there are employed a first input multiplexer 220a corresponding to the zeroth upper local I/O line LIO_U<0>, a first input multiplexer 210a corresponding to the fourth upper local I/O line LIO_U<4>, and drivers DRV15 and DRV16 corresponding to bottom local I/O lines LIO_L<4> and LIO_L<0>.

Herein, the first output multiplexer 220a corresponding to the zeroth upper local I/O line LIO_U<0> is configured with a driver DRV14 responsive to a control signal G, and a driver DRV13 responsive to a control signal H. Although the first output multiplexers (not shown) corresponding to the first to third upper local I/O lines LIO_U<1:3> are also similarly configured, they are connected to different global I/O lines, respectively. That is, the first output multiplexer 220a is connected to the global I/O lines GIO_L<0> and GIO_U<0>. Similarly, the first output multiplexer (not shown) corresponding to the first upper local I/O line LIO_U<1> is connected to the global I/O lines GIO_L<1> and GIO_U<1>, and the first output multiplexer (not shown) corresponding to the second upper local I/O line LIO_U<2> is connected to the global I/O lines GIO_L<2> and GIO_U<2>. Likewise, the first output multiplexer (not shown) corresponding to the third upper local I/O line LIO_U<3> is connected to the global I/O lines GIO_L<3> and GIO_U<3>.

Meanwhile, the first output multiplexer 210a corresponding to the fourth upper local I/O line LIO_U<4> is configured with a driver DRV12 responsive to a control signal I and a driver DRV11 responsive to a control signal J. Although the first output multiplexers (not shown) corresponding to the fifth to seventh upper local I/O lines LIO_U<5:7> also have the same configuration as the first output multiplexer 210a, they are connected to different global I/O lines, respectively. In detail, the first output multiplexer 210a corresponding to the fourth upper local I/O line LIO_U<4> is connected to the global I/O lines GIO_L<4> and GIO_U<4>, and the first output multiplexer (not shown) corresponding to the fifth upper local I/O line LIO_U<5> is connected to the global I/O lines GIO_L<5> and GIO_U<5>. Likewise, the first input multiplexer (not shown) corresponding to the sixth upper local I/O line LIO_U<6> is connected to the global I/O lines GIO_L<6> and GIO_U<6>, and the first input multiplexer (not shown) corresponding to the seventh upper local I/O line LIO_U<7> is connected to the global I/O lines GIO_L<7> and GIO_U<7>. In addition, other drivers (not shown) corresponding to the bottom local I/O lines LIO_L<0:7> are connected to the bottom global I/O lines GIO_L<0:7>, respectively.

In the second output multiplexer 200b, a second output multiplexer 210b corresponding to the zeroth bottom data I/O pad LDQ<0> is representatively illustrated, wherein the second output multiplexer 210b is configured with a 2-input multiplexer MUX33 controlled by the column address signal CA<11> and the data option signal x4.

Herein, although the second output multiplexers (not shown) corresponding to the bottom data I/O pads LDQ<1:3> have the same configuration as the second output multiplexer 210b, they are connected to different global I/O lines, respectively. Namely, the second output multiplexer 210b corresponding to the zeroth bottom data I/O pad LDQ<0> is connected to the global I/O lines GIO_L<0> and GIO_L<4>, and the second output multiplexer (not shown) corresponding to the first bottom data I/O pad LDQ<1> is connected to the global I/O lines GIO_L<1> and GIO_L<5>. Likewise, the second output multiplexer (not shown) corresponding to the second bottom data I/O pad LDQ<2> is connected to the global I/O lines GIO_L<2> and GIO_L<6>, and the second output multiplexer (not shown) corresponding to the third bottom data I/O pad LDQ<3> is connected to the global I/O lines GIO_L<3> and GIO_L<7>.

Table 7 illustrates the state of logic level of the control signal G, H, I and J which is generated in response to the data option signal x4, x8 and x16, the row address signal RA<13> and the column address signal CA<11>. The first output multiplexer 200a may select a predetermined global I/O line according to the control signal G, H, I and J, and apply the data to the predetermined global I/O line.

TABLE 7

|  | RA<13> | CA<11> | G | H | I | J |
|---|---|---|---|---|---|---|
| x4 | 0 | 0 | 1 | 0 | 0 | 0 |
|  | 0 | 1 | 0 | 0 | 1 | 0 |
|  | 1 | 0 | 0 | 0 | 0 | 0 |
|  | 1 | 1 | 0 | 0 | 0 | 0 |
| x8 | 0 | x | 1 | 0 | 1 | 0 |
|  | 1 | x | 0 | 0 | 0 | 0 |
| x16 | x | x | 0 | 1 | 0 | 1 |

Table 8 illustrates the global I/O line GIO_L<4> and GIO_L<0> selected according to the data option signal x4 and the column address signal CA<11>, wherein the data option signal x4 and the column address signal CA<11> control the second output multiplexer 200b.

TABLE 8

|  | RA<13> | CA<11> | OUT |
|---|---|---|---|
| x4 | 0 | 0 | GIO_L<0> |
|  | 0 | 1 | GIO_L<4> |
|  | 1 | 0 | GIO_L<0> |
|  | 1 | 1 | GIO_L<0> |
| x8 | 0 | x | GIO_L<0> |
|  | 1 | x | GIO_L<0> |
| x16 | x | x | GIO_L<0> |

Considering the data output operation with reference to the tables 7 and 8, for example, 8-bit data of the bottom or upper local I/O lines LIO_L<0:7> or LIO_U<0:7> are amplified by a corresponding sense amplifier 80, in case of 'x8' operation mode outputting the 8-bit data. Herein, when the 8-bit data are applied to the bottom local I/O lines LIO_L<0:7>, the data are applied to the bottom global I/O lines GIO_L<0:7> by means of the drivers DRV15 and DRV16 corresponding to the bottom local I/O lines LIO_L<0:7>. The global I/O lines GIO_L<0:3> are selected by the second multiplexer 200b and the data of the global I/O lines GIO_L<0:3> are then inputted to a corresponding pipe latch 110. Likewise, the data of the global I/O lines GIO_L<4:7> are inputted to a corresponding pipe latch 110. The pipe latch 110 outputs the data to the corresponding bottom data I/O pads LDQ<0:7>. In addition, when the 8-bit data are applied to the upper local I/O lines LIO_U<0:7>, the 8-bit data are applied to the bottom global I/O lines GIO_L<0:7> by means of the first output multiplexer 200a, and they are outputted to the bottom data I/O pads LDQ<0:7> through the same path.

Considering the 'x4' operation mode in detail, 4-bit data to be outputted from the local I/O lines LIO_L<0:3>, LIO_L<4:7>, LIO_U<0:3> or LIO_U<4:7> are outputted to the bottom data I/O pads LDQ<0:3> by the first and second output multiplexers 200a and 200b. For instance, the 4-bit data to be outputted from the local I/O lines LIO_L<0:3> are applied to the global I/O lines GIO_L<0:3> through the driver DRV16. The 4-bit data supplied to the global I/O lines GIO_L<0:3> may be selected by the 2-input multiplexer MUX33 of the second multiplexer, and then outputted to the data I/O pads LDQ<0:3> through the corresponding pipe latch 110. Furthermore, the 4-bit data to be outputted from the local I/O lines LIO_L<4:7> are applied to the global I/O lines GIO_L<4:7> through the driver DRV15. The 4-bit data supplied to the global I/O lines GIO_L<4:7> may be selected by the 2-input multiplexer MUX33 of the second multiplexer, and then outputted to the data I/O pads LDQ<0:3> through the corresponding pipe latch 110. Likewise, the 4-bit data to be outputted from the local I/O lines LIO_U<0:3> are applied to the global I/O lines GIO_L<0:3> through the driver DRV14 in response to the control signal G. The 4-bit data supplied to the global I/O lines GIO_L<0:3> may be selected by the 2-input multiplexer MUX33, and then outputted to the data I/O pads LDQ<0:3> through the corresponding pipe latch 110. The 4-bit data to be outputted from the local I/O lines LIO_U<4:7> are applied to the global I/O lines GIO_L<4:7> through the driver DRV12 in response to the control signal I. The 4-bit data supplied to the global I/O lines GIO_L<4:7> may be selected by the 2-input multiplexer MUX33, and then outputted to the data I/O pads LDQ<0:3> through the corresponding pipe latch 110.

The 'x16' operation mode may be fully understood by those skilled in the art through the aforementioned descriptions for the 'x4' and 'x8' operation modes, and thus further descriptions will be omitted herein.

Figure 9:
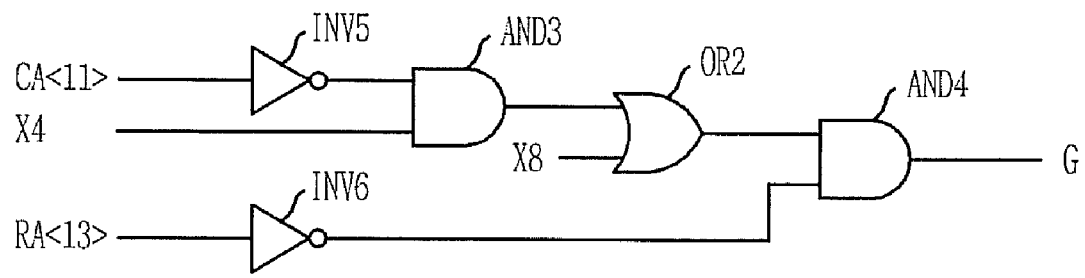
FIG. 9 is a schematic circuit diagram illustrating a control signal generator for controlling the first output multiplexer shown in FIG. 8.
Figure 9:
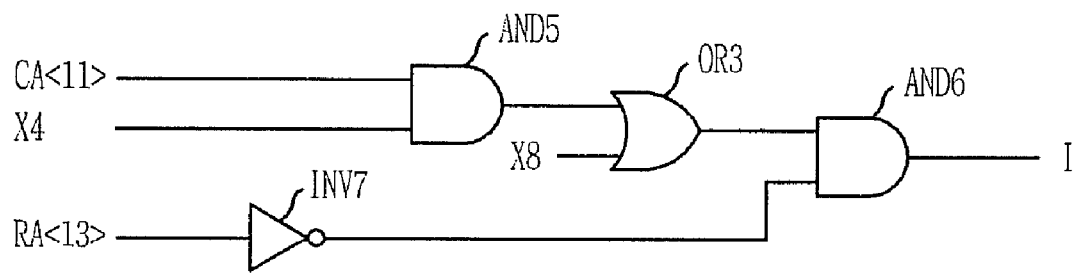

FIG. 9 is a schematic circuit diagram illustrating an output control signal generator for generating the control signals G, H, I, and J which are inputted to the first output multiplexer 200a shown in FIG. 8.

Referring to FIG. 9, the output control signal generator includes an inverter INV5, a logic AND gate AND3, a logic OR gate OR2, an inverter INV6, a logic AND gate AND4, a logic AND gate AND5, a logic OR gate OR3, an inverter INV7, and logic AND gate AND6. The inverter INV5 inverts the column address signal CA<11>. The logic AND gate AND3 receives the output signal of the inverter INV5 and the data option signal x4. The logic OR gate OR2 receives the output signal of the logic AND gate AND3 and the data option signal x8. The inverter INV6 inverts the row address signal RA<13>. The logic AND gate AND4 receives the output signals of the logic OR gate OR2 and the inverter INV6 to output the control signal G. The logic AND gate AND5 receives the column address signal CA<11> and the data option signal x4. The logic OR gate OR3 receives the output signal of the logic AND gate AND5 and the data option signal x8. The inverter INV7 inverts the row address signal RA<13>. The logic AND gate AND6 receives the output signal of the inverter INV7 and the output signal of the logic OR gate OR3 to output the control signal I. Herein, the data option signal x16 is used for outputting the control signals H and J.

Figure 10:
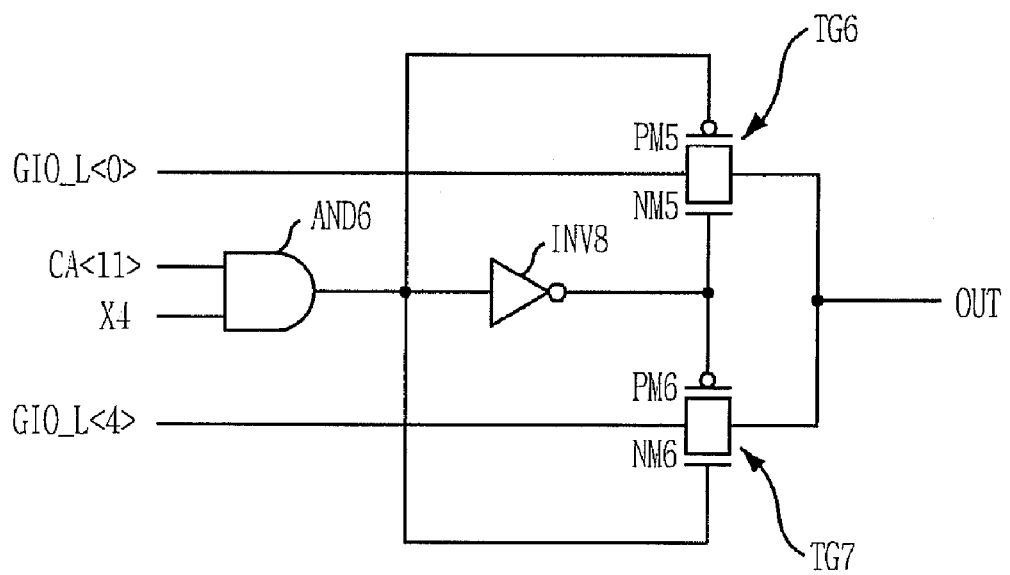
FIG. 10 is a schematic circuit diagram illustrating the second output multiplexer shown in FIG. 8.

FIG. 10 is a schematic circuit diagram illustrating the second output multiplexer 200b shown in FIG. 8.

Referring to FIG. 10, the second output multiplexer 200b connected to the zeroth and fourth bottom global I/O lines GIO_L<0> and GIO_L<4>, includes a logic AND gate AND6 for receiving the data option signal x4 and the column address signal CA<11>, an inverter INV8 for inverting the output signal of the logic AND gate AND6, a transfer gate TG6 for outputting the data supplied to the zeroth bottom global I/O line GIO_L<0> in response to the output signal of the logic AND gate AND6 and the output signal of the inverter INV8, and a transfer gate TG7 for outputting the data supplied to the fourth bottom global I/O line GIO_L<4>.

As described above, the inventive I/O multiplexer includes the first and second I/O multiplexers at both sides of the global I/O lines, wherein the first one is opposite to the second one. Therefore, the I/O multiplexers are evenly spaced apart from each other by an appropriate distance in the present invention, whereas they are densely disposed around a specific data I/O pad according to the prior art.

That is, referring to FIG. 5, each of the first input multiplexers 110a corresponding to the bottom data I/O pads LDQ<0:3> is configured with the two drivers DRV11 and DRV12. Such an inventive configuration enables the layout area to be reduced to more than half thereof in comparison with the conventional multiplexer employing four drivers therein. In addition, referring to FIG. 8, since each of the second multiplexers 210b corresponding to the respective bottom data I/O pads LDQ<0:3> may be configured with the 2-input multiplexer MUX33 instead of the conventional 4-input multiplexer, it is possible to reduce the layout area, too.

In conclusion, the present invention has such an advantageous merit that a chip size of a semiconductor decreases by reducing the layout area because the first and second I/O multiplexers are disposed at both sides of the global I/O lines. Further, it is possible to maintain internal circuits of the chip to be evenly spaced apart by an appropriate distance from each other, which helps the interference of the internal circuits and malfunction to be effectively prevented.

The present application contains subject matter related to the Korean patent applications Nos. KR 10-2005-0091548 and KR 10-2006-0049113, filed in the Korean Patent Office on Sep. 29, 2005 and on May 31, 2006 respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor device, comprising:
an input multiplexing unit including a first input multiplexer for selectively multiplexing and supplying an input data from a data I/O pad to global I/O lines according to a data input operation mode and a second input multiplexer for selectively multiplexing and supplying the multiplexed input data on at least two global I/O lines to a local I/O line according to the data input operation mode; and
an output multiplexing unit including a first output multiplexer for selectively multiplexing and supplying an output data from the local I/O line to the global I/O lines according to a data output operation mode and a second output multiplexer for selectively multiplexing and supplying the multiplexed output data on the global I/O lines to the data I/O pad according to the data output operation mode, wherein the data input operation mode and the data output operation mode are configured to change according to a change in a number of data bits that are to be simultaneously written or read from the semiconductor device at one time during a data input or output operation.

2. The semiconductor device of claim 1, further comprising a first multiplexer control signal generator for controlling the first multiplexer.

3. The semiconductor device of claim 2, wherein the output multiplexing unit is configured to be driven by a control signal that includes a data option signal.

4. A semiconductor device, comprising:
a data input/output (I/O) pad for receiving data;
a first input multiplexer for multiplexing the data input through the data I/O pad and supplying a first multiplexed data to global I/O lines, wherein the first input multiplexer is disposed between the data I/O pad and the global I/O lines to selectively multiplex according to a data input operation mode; and
a second input multiplexer for selectively multiplexing the first multiplexed data supplied from at least two global I/O lines and supplying a second multiplexed data to a local input/output (I/O) line, wherein the second input multiplexer is disposed between the global I/O lines and the local I/O line to selectively multiplex according to the data input operation mode, wherein the data input operation mode is configured to change according to a change in a number of data bits that are to be simultaneously written in the semiconductor device at one time during a data input operation.

5. The semiconductor device of claim 4, further comprising a first multiplexer control signal generator for controlling the first input multiplexer.

6. The semiconductor device of claim 5, wherein the second input multiplexer is driven by a control signal containing a data option signal.

7. The semiconductor device of claim 4, further comprising a data input sense amplifier for sensing and amplifying a signal supplied to the data I/O pad to provide the amplified signal to the first input multiplexer.

8. The semiconductor device of claim 4, wherein the second input multiplexer includes further comprising a write driver for driving an output in being provided to the local I/O line.

9. A semiconductor device, comprising:
a local I/O line for transferring data outputted from cell array;
a first output multiplexer for multiplexing data on the local I/O line and supplying the multiplexed data to at least two global I/O lines, wherein the first output multiplexer is disposed between the local I/O line and the global I/O lines to selectively multiplex according to a data output operation mode; and
a second output multiplexer for multiplexing and supplying the multiplexed data on the global I/O line to a data I/O pad, wherein the second output multiplexer is disposed between the global I/O line and the data I/O pad to selectively multiplex according to the data output operation mode, wherein the data output operation mode is configured to change according to a change in a number of data bits that are to be simultaneously read from the semiconductor device at one time during a data output operation.

10. The semiconductor device of claim 9, further comprising a first multiplexer control signal generator for controlling the first output multiplexer.

11. The semiconductor device of claim 10, wherein the second output multiplexer is driven by a control signal that includes a data option signal.

12. The semiconductor device of claim 9, further comprising a sense amplifier for sensing and amplifying a signal supplied to the local I/O line to provide the amplified signal to the first output multiplexer.

13. The semiconductor device of claim 9, further comprising a pipe latch for latching the output signal of the second output multiplexer and providing the latched signal to the data I/O pad.

14. The semiconductor memory device of claim 1, wherein the data input operation mode includes X4, X8, and X16 modes, wherein the X4 mode is a data input mode for receiving 4 bit data in response to one data access command, the X8 mode is a data input mode for receiving 8 bit data in response to one data access command, and the X16 mode is a data input mode for receiving 16 bit data in response to one data access command.

15. The semiconductor memory device of claim 1, wherein the data output operation mode includes X4, X8, and X16 modes, wherein the X4 mode is a data output mode for outputting 4 bit data in response to one data access command, the X8 mode is a data output mode for outputting 8 bit data in response to one data access command, and the X16 mode is a data output mode for outputting 16 bit data in response to one data access command.

16. The semiconductor memory device of claim 4, wherein the data input operation mode includes X4, X8, and X16 modes, wherein the X4 mode is a data input mode for receiving 4 bit data in response to one data access command, the X8 mode is a data input mode for receiving 8 bit data in response to one data access command, and the X16 mode is a data input mode for receiving 16 bit data in response to one data access command.

17. The semiconductor memory device of claim 9, wherein the data output operation mode includes X4, X8, and X16 modes, wherein the X4 mode is a data output mode for outputting 4 bit data in response to one data access command, the X8 mode is a data output mode for outputting 8 bit data in response to one data access command, and the X16 mode is a data output mode for outputting 16 bit data in response to one data access command.

* * * * *